(12) United States Patent
Wei et al.

(10) Patent No.: US 12,339,581 B2
(45) Date of Patent: Jun. 24, 2025

(54) PHOTOLITHOGRAPHIC MASK OPTIMIZATION METHOD AND SYSTEM WITHOUT BORDER DEFECTS

(71) Applicant: Wuhan Yuwei Optical Software Co., Ltd., Hubei (CN)

(72) Inventors: Haiqing Wei, Hubei (CN); Xianhua Ke, Hubei (CN)

(73) Assignee: WUHAN YUWEI OPTICAL SOFTWARE CO., LTD., Hubei (CN)

( * ) Notice: Subject to any disclaimer, the term of this patent is extended or adjusted under 35 U.S.C. 154(b) by 464 days.

(21) Appl. No.: 17/993,722

(22) Filed: Nov. 23, 2022

(65) Prior Publication Data

US 2024/0069432 A1 Feb. 29, 2024

(30) Foreign Application Priority Data

Aug. 29, 2022 (CN) .......................... 202211040885.9

(51) Int. Cl.
*G03F 1/36* (2012.01)
*G06T 7/00* (2017.01)

(52) U.S. Cl.
CPC .............. *G03F 1/36* (2013.01); *G06T 7/0004* (2013.01); *G06T 2207/20021* (2013.01); *G06T 2207/30148* (2013.01)

(58) Field of Classification Search
CPC ........ G03F 1/36; G03F 1/398; G03F 7/70441; G03F 7/70508; G06T 7/00; G06T 2207/20021; G06T 2207/30148; G06T 7/0004; G06F 30/398
USPC .................................................. 382/100, 144
See application file for complete search history.

(56) References Cited

U.S. PATENT DOCUMENTS

2019/0187552 A1* 6/2019 Choi .................... G03F 7/70441
2019/0197213 A1* 6/2019 Holzheimer ........... B01D 46/42
96/174

* cited by examiner

*Primary Examiner* — Sheela C Chawan
(74) *Attorney, Agent, or Firm* — HSML P. C.

(57) ABSTRACT

Methods and systems of photolithographic mask optimization without border defects are provided. Two sets of meshes of odd splitting and even splitting performed in a staggered manner are used to obtain slices, and the mask patterns of the slices obtained by the odd splitting and even splitting are corrected once in sequence in a single iteration process. The iteration process is executed circularly until all slices meet the requirements on error, so as to eliminate the impact of a boundary effect. The two sets of splitting meshes consist of different partitions, thereby avoiding the problem of border defects caused by single splitting of a mask layout of a traditional mask optimization method.

10 Claims, 4 Drawing Sheets

FIG. 1

(a) Schematic diagram of odd-splitting meshes (b) Schematic diagram of even-splitting meshes

PHOTOLITHOGRAPHIC MASK OPTIMIZATION METHOD AND SYSTEM WITHOUT BORDER DEFECTS

TECHNICAL FIELD

The present invention belongs to the field of photolithographic mask optimization, and in particular relates to a photolithographic mask optimization method and system without border defects.

BACKGROUND ART

In recent years, rapid development of information technology has driven the integrated circuit chips toward smaller feature sizes. Photolithography is a key link in the manufacturing of semiconductor chips of integrated circuits, and its cost accounts for more than one third of the manufacturing cost of a whole chip, and a mask aligner is a core device in chip manufacturing. The level of photolithography reflects the ability of transferring the layout information designed on a mask onto a silicon wafer, and a photolithographic system mainly consists of four parts: an illuminating light source, a mask plate, a projection objective system, and a photoresist-coated wafer. A light source irradiates the mask to obtain a mask near field, a projection objective converges the information of the mask near field onto the photoresist, and a mask pattern is replicated on the wafer through the techniques such as developing, rinsing, and etching. At present, most of the mask aligners use deep ultraviolet light with a wavelength of 193 nm or a polar ultraviolet light with a wavelength of 13.5 nm as a light source of the illuminating system, while key dimensions of integrated circuit chips have already reached a technical node of 5 nm, and the patterns on mask plates are of sizes already approximate to or much less than the wavelength of the illuminating light source, which will prompt the light waves to be inevitably diffracted when passing through the mask and lead to varying degrees of distortion of the patterns projected onto the photoresist, thereby affecting the realization of the designed functions of integrated circuits. This phenomenon is called OPE (Optical Proximity Effect). In order to obtain an exposed pattern meeting the design expectations from the photoresist, reduce pattern distortion and improve the resolution of the photolithographic imaging system, when designing a mask pattern, it is required to optimize the mask pattern through an OPC (Optical Proximity Correction) method.

The OPC optimizes an initial mask layout through a series of algorithms, to achieve an aim of improving the photolithographic resolution; and the model-based OPC commonly used at present includes two major processes: forward photolithographic imaging emulation and reverse iterative optimization. When performing OPC, it is required to split the whole mask layout into different small slices, and forward photolithographic imaging calculation and reverse iterative optimization are both used to deal with the split slices. In the existing method, only one splitting is performed throughout, single slices obtained by the splitting are subjected to OPC treatment, and at last, the ROIs (region of interest) of all slices are merged together through a boundary matching and repairing algorithm, to obtain a whole optimized mask layout. This method updates the OPC result by taking the ROI after one splitting as a minimum unit. Under the impact of a boundary effect during the process of forward photolithographic imaging emulation, the originally continuous pattern lines on the boundary are intercepted, and the pattern environment around is thus changed, which causes a single slice to independently and separately perform circular optimization on a corresponding mask pattern through OPC. The mask optimization result of its border part largely depends on the pattern inside current slice, and is totally unrelated to the mask pattern of a neighboring slice. As a result, the mask correction results of adjacent slices are unmatched at the parts approaching the border, and the slices cannot be merged directly, which requires OPC aftertreatment through an inter-slice boundary matching and repairing algorithm. The OPC aftertreatment increases the time of the process of optimizing the whole mask layout, and corresponding boundary matching and repairing algorithm has limited efficiency and accuracy and reduces the occurrence of border defects only to a certain extent, thereby restricting the improvement of the OPC optimization effect.

Therefore, there is an urgent need for a full-ROI mask optimization method which can eliminate border defects, obtain a mask optimization result better fitting the technological practice, improve the overall optimization effect of OPC, and enhance the manufacturability of mask optimization.

SUMMARY OF THE INVENTION

In view of the defects of the prior art, an objective of the present invention is to provide a photolithographic mask optimization method and system without border defects, which aims to address the problems in border defects and calculation efficiency present in existing photolithographic mask pattern optimization method which performs repeated iteration based on the slices obtained by one splitting and then merges the slices through a boundary matching and repairing algorithm.

To achieve the above objective, on one aspect, the present invention provides a photolithographic mask optimization method without border defects, comprising the steps:

determining a mask image corresponding to a mask pattern to be optimized, extending the periphery of the mask image outward, and setting a pixel value of the extended region to 0, to obtain an expanded mask image;

performing first splitting on the current mask image to obtain a plurality of first slices, performing forward photolithographic imaging on the plurality of first slices to obtain a plurality of first emulated patterns of the plurality of first slices on a photoresist, and calculating a plurality of first edge placement errors of the plurality of first emulated patterns from corresponding target patterns respectively, wherein the target patterns are patterns desired from the photoresist;

when any error among the plurality of first edge placement errors exceeds a threshold, performing first side-shift correction on the mask pattern to be optimized according to reverse solution results of the plurality of first edge placement errors, and then merging the plurality of first slices and obtaining an updated mask image and an updated expanded mask image;

performing second splitting on the current expanded mask image to obtain a plurality of second slices, and extending the expanded mask image outward for a preset distance relative to the mask image, the first splitting and the second splitting being staggered from each other to ensure that boundaries of ROIs (region of interest) of the plurality of first slices all appear inside ROIs of the plurality of second slices;

performing forward photolithographic imaging on the plurality of second slices to obtain a plurality of second emulated patterns of the plurality of second slices on the photoresist, and calculating a plurality of second edge placement errors of the plurality of second emulated patterns from corresponding target patterns respectively;

when any error among the plurality of second edge placement errors exceeds a threshold, performing second side-shift correction on the mask pattern to be optimized according to reverse solution results of the plurality of second edge placement errors, and then merging the plurality of second slices and obtaining an updated mask image and an updated expanded mask image; and repeating the above-mentioned correction process on the newly obtained mask image and the newly obtained expanded mask image until none of the obtained plurality of edge placement errors exceeds the threshold, then merging a plurality of slices obtained by final splitting, and outputting a mask image optimized by final correction.

In an optional example, the performing first splitting on the mask image to obtain a plurality of first slices specifically comprises:

uniformly splitting the mask image into a plurality of first rectangular images of the same area, a first rectangular image corresponding to the ROI of a first slice.

In an optional example, the performing second splitting on the expanded mask image to obtain a plurality of second slices specifically comprises:

uniformly splitting the expanded mask image into a plurality of second rectangular images of the same area, a second rectangular image corresponding to the ROI of a second slice, and an ROI area of the second slice being an integral multiple of an ROI area of the first slice, the boundaries of the ROIs of the plurality of second slices not overlapping with the boundaries of the ROIs of the plurality of first slices, and the boundaries of the ROIs of the plurality of first slices all being inside the ROIs of the plurality of second slices.

In an optional example, the ROI area of the second slice is N times the ROI area of the first slice, and N is an integer greater than or equal to 1, and specifically, the transverse side length of the ROI of the second slice is $N_1$ times the transverse side length of the ROI of the first slice, the longitudinal side length of the ROI of the second slice is $N_2$ times the longitudinal side length of the ROI of the first slice, $N_1 * N_2 = N$, and $N_1$ and $N_2$ are both an integer greater than or equal to 1.

In an optional example, the extending the expanded mask image outward for a preset distance relative to the mask image specifically comprises:

extending a transverse side of the expanded mask image outward for a first distance along a longitudinal direction;

extending another transverse side of the expanded mask image outward for a second distance along a longitudinal direction;

extending a longitudinal side of the expanded mask image outward for a third distance along a transverse direction; and extending another longitudinal side of the expanded mask image outward for a fourth distance along a transverse direction, wherein the first distance, the second distance, the third distance, and the fourth distance are based on the ROI area of the second slice being N times the ROI area of the first slice while the boundaries of the ROIs of the plurality of first slices all appear inside the ROIs of the plurality of second slices.

In an optional example, the ROI area of the first slice is set to be equal to the ROI area of the second slice, and both the ROI of the first slice and the ROI of the second slice are a square;

the periphery of the mask image is extended outward for half of the side length of the square, to obtain the expanded mask image;

and the transverse sides and longitudinal sides of the ROI of the second slice are all controlled to deviate from corresponding sides of the ROI of the first slice for half of the side length of the square, and the expanded mask image is split to obtain the plurality of second slices.

On a second aspect, the present invention provides a photolithographic mask optimization system without border defects, comprising:

a mask image determining unit for determining a mask image corresponding to a mask pattern to be optimized, extending the periphery of the mask image outward, and setting a pixel value of the extended region to 0, to obtain an expanded mask image;

a first splitting unit for performing first splitting on the current mask image to obtain a plurality of first slices, performing forward photolithographic imaging on the plurality of first slices to obtain a plurality of first emulated patterns of the plurality of first slices on a photoresist, calculating a plurality of first edge placement errors of the plurality of first emulated patterns from corresponding target patterns respectively, wherein the target patterns are patterns desired from the photoresist, performing first side-shift correction on the mask pattern to be optimized according to reverse solution results of the plurality of first edge placement errors when any error among the plurality of first edge placement errors exceeds a threshold, and merging the plurality of first slices and obtaining an updated mask image and an updated expanded mask image;

a second splitting unit for performing second splitting on the current expanded mask image to obtain a plurality of second slices, extending the expanded mask image outward for a preset distance relative to the mask image, the first splitting and the second splitting being staggered from each other to ensure that boundaries of ROIs (region of interest) of the plurality of first slices all appear inside ROIs of the plurality of second slices, performing forward photolithographic imaging on the plurality of second slices to obtain a plurality of second emulated patterns of the plurality of second slices on the photoresist, calculating a plurality of second edge placement errors of the plurality of second emulated patterns from corresponding target patterns respectively, performing second side-shift correction on the mask pattern to be optimized according to reverse solution results of the plurality of second edge placement errors when any error among the plurality of second edge placement errors exceeds a threshold, and merging the plurality of second slices and obtaining an updated mask image and an updated expanded mask image; and an iterative splitting unit for repeating the above-mentioned correction process on the newly obtained mask image and the newly obtained expanded mask image until none of the obtained plurality of edge placement errors exceeds the threshold, merging a plurality of slices obtained by final splitting, and outputting a mask image optimized by final correction.

In an optional example, the first splitting unit performing first splitting on the mask image to obtain a plurality of first slices specifically comprises: uniformly splitting the mask image into a plurality of first rectangular images of the same area, a first rectangular image corresponding to the ROI of a first slice; and the second splitting unit performing second splitting on the expanded mask image to obtain a plurality of second slices specifically comprises: uniformly splitting the expanded mask image into a plurality of second rectangular images of the same area, a second rectangular image corresponding to the ROI of a second slice, an ROI area of the second slice being an integral multiple of an ROI area of the first slice, the boundaries of the ROIs of the plurality of second slices not overlapping with the boundaries of the ROIs of the plurality of first slices, and the boundaries of the ROIs of the plurality of first slices all being inside the ROIs of the plurality of second slices.

In an optional example, the ROI area of the second slice obtained from splitting by the second splitting unit is N times the ROI area of the first slice, and N is an integer greater than or equal to 1, and specifically, the transverse side length of the ROI of the second slice is $N_1$ times the transverse side length of the ROI of the first slice, the longitudinal side length of the ROI of the second slice is $N_2$ times the longitudinal side length of the ROI of the first slice, $N_1*N_2=N$, and $N_1$ and $N_2$ are both an integer greater than or equal to 1.

In an optional example, the extending the expanded mask image determined by the mask image determining unit outward for a preset distance relative to the mask image specifically comprises: extending a transverse side of the expanded mask image outward for a first distance along a longitudinal direction; extending another transverse side of the expanded mask image outward for a second distance along a longitudinal direction; extending a longitudinal side of the expanded mask image outward for a third distance along a transverse direction; and extending another longitudinal side of the expanded mask image outward for a fourth distance along a transverse direction, wherein the first distance, the second distance, the third distance, and the fourth distance are based on the ROI area of the second slice being N times the ROI area of the first slice while the boundaries of the ROIs of the plurality of first slices all appear inside the ROIs of the plurality of second slices.

In general, compared with the prior art, the above technical solutions proposed in the present invention have the following beneficial effects:

The present invention provides a photolithographic mask optimization method and system without border defects. Two sets of meshes of odd splitting and even splitting performed in a staggered manner are used to obtain slices, and the impact of a boundary effect is eliminated. The two sets of splitting meshes consist of different partitions, where the inside of the ROIs (region of interest) of the slices obtained by the odd splitting accommodates the boundaries of the ROIs of the slices obtained by the even splitting, and the inside of the ROIs of the slices obtained by the even splitting accommodates the boundaries of the ROIs of the slices obtained by the odd splitting, such that the boundary patterns of the ROIs of the slices obtained by the odd splitting can be put inside the ROIs of the slices obtained by the even splitting for accurate optimization; and similarly, the boundary patterns of the ROIs of the slices obtained by the even splitting can be put inside the ROIs of the slices obtained by the odd splitting for accurate optimization, thereby avoiding the problems of border distortion and the like caused by the boundary effect and boundary mismatch.

The present invention provides a photolithographic mask optimization method and a system without border defects. Correction of the slices obtained by odd splitting and correction of the slices obtained by even splitting are performed in sequence in a single iteration process, and then the iteration process is repeated circularly. Each correction of every iteration process represents a gradual optimization based on previous correction, thereby avoiding the problem of border defects caused by single splitting of the mask layout in a traditional mask optimization method, and improving the accuracy of mask optimization. OPC aftertreatment operations such as boundary matching and repairing are not needed, thus the optimization efficiency is improved, and photolithographic mask optimization without border defects and with full-ROI coverage can be realized.

DETAILED DESCRIPTION

To make the purpose, technical solution, and advantages of the present invention clearer, the present invention is further described in detail below in connection with the accompanying drawings and embodiments. It should be understood that the specific embodiments described herein are only used to explain the present invention, but not to limit the present invention. The present disclosure provides a photolithographic mask optimization method and system without border defects. Two sets of meshes of odd splitting and even splitting performed in a staggered manner are used to obtain slices, and the mask patterns of the slices obtained by the odd splitting and even splitting are corrected once in sequence in a single iteration process. The iteration process is executed circularly until all slices meet the requirements on error, so as to eliminate the impact of a boundary effect. The two sets of splitting meshes consist of different partitions, where the inside of the ROIs (region of interest) of the slices obtained by the odd splitting accommodates the boundaries of the ROIs of the slices obtained by the even splitting, and the inside of the ROIs of the slices obtained by the even splitting accommodates the boundaries of the ROIs of the slices obtained by the odd splitting, such that the boundary patterns of the ROIs of the slices obtained by the odd splitting can be put inside the ROIs of the slices obtained by the even splitting for accurate optimization; and similarly, the boundary patterns of the ROIs of the slices obtained by the even splitting can be put inside the ROIs of the slices obtained by the odd splitting for accurate optimization, thereby avoiding the problem of border defects caused by single splitting of a mask layout of a traditional mask optimization method.

The present invention belongs to the technical field concerning computational photolithography in the semiconductor industry, and specifically discloses a mask optimization method that can be applied to optical proximity effect (OPC). The method employs a strategy of staggered splitting of slices as well as a new idea of stepwise, partitioned and hybrid iterative optimization, and realizes full-mask OPC (optical proximity effect) without border defects and with full-ROI (region of interest) coverage. The main innovation points include:

two sets of meshes of odd splitting and even splitting performed in a staggered manner being used to obtain slices, and the impact of a boundary effect being eliminated. The two sets of splitting meshes consist of different partitions, where the inside of the ROIs (region of interest) of the slices obtained by the odd splitting accommodates the boundaries of the ROIs of the slices obtained by the even splitting, the inside of the ROIs of the slices obtained by the even splitting accommodates the boundaries of the ROIs of the slices obtained by the odd splitting, and iterative optimization is performed on the mask pattern through stepwise, partitioned and hybrid means, thereby avoiding the problems of border distortion and the like caused by the boundary effect and boundary mismatch.

During each iteration, an interface part between the optimized ROI and the Ambit is smoothened, to obtain a full-mask layout optimization result which better conforms to the photolithographic practice and has higher manufacturability.

In view of the defects of the prior art, the present invention proposes a photolithographic mask optimization method without border defects, which aims to avoid the problem of a boundary effect caused by single splitting of a mask layout in a traditional mask optimization method by employing a strategy of staggered splitting of slices as well as a new idea of stepwise, partitioned and hybrid iterative optimization; and the method does not need boundary matching and repairing and can realize photolithographic mask optimization without border defects and with full-ROI coverage.

Figure 1:
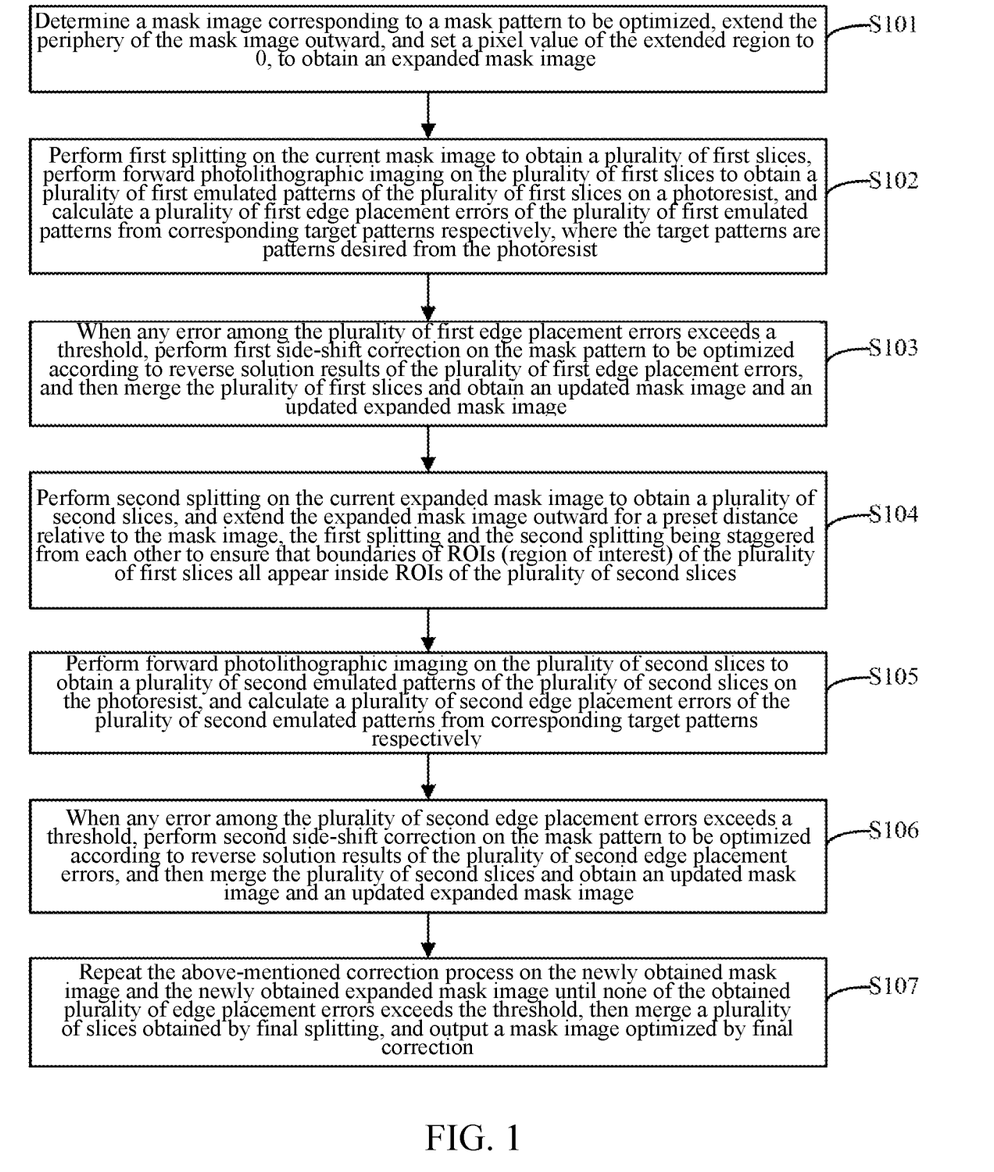
FIG. 1 is a flow diagram illustrating a photolithographic mask optimization method without border defects provided according to an embodiment of the present invention.

FIG. 1 is a flow diagram illustrating a photolithographic mask optimization method without border defects provided according to an embodiment of the present invention; and as shown in FIG. 1, the method comprises the following steps:

S101, determining a mask image corresponding to a mask pattern to be optimized, extending the periphery of the mask image outward, and setting a pixel value of the extended region to 0, to obtain an expanded mask image;

S102, performing first splitting on the current mask image to obtain a plurality of first slices, performing forward photolithographic imaging on the plurality of first slices to obtain a plurality of first emulated patterns of the plurality of first slices on a photoresist, and calculating a plurality of first edge placement errors of the plurality of first emulated patterns from corresponding target patterns respectively, wherein the target patterns are patterns desired from the photoresist;

S103, when any error among the plurality of first edge placement errors exceeds a threshold, performing first side-shift correction on the mask pattern to be optimized according to reverse solution results of the plurality of first edge placement errors, and then merging the plurality of first slices and obtaining an updated mask image and an updated expanded mask image;

S104, performing second splitting on the current expanded mask image to obtain a plurality of second slices, and extending the expanded mask image outward for a preset distance relative to the mask image, the first splitting and the second splitting being staggered from each other to ensure that boundaries of ROIs (region of interest) of the plurality of first slices all appear inside ROIs of the plurality of second slices;

S105, performing forward photolithographic imaging on the plurality of second slices to obtain a plurality of second emulated patterns of the plurality of second slices on the photoresist, and calculating a plurality of second edge placement errors of the plurality of second emulated patterns from corresponding target patterns respectively;

S106, when any error among the plurality of second edge placement errors exceeds a threshold, performing second side-shift correction on the mask pattern to be optimized according to reverse solution results of the plurality of second edge placement errors, and then merging the plurality of second slices and obtaining an updated mask image and an updated expanded mask image; and S107, repeating the above-mentioned correction process on the newly obtained mask image and the newly obtained expanded mask image until none of the obtained plurality of edge placement errors exceeds the threshold, then merging a plurality of slices obtained by final splitting, and outputting a mask image optimized by final correction.

In an embodiment, according to one aspect of the present invention, a photolithographic mask optimization method without border defects is provided. At first, original mask layout is split using odd-splitting meshes, which is called odd splitting; then, the mask layout is subjected to extension filling, and the expanded mask layout is split using even-splitting meshes by deviating the slice center for a specific distance, which is called even splitting; next, the ROIs of the slices obtained by the two splitting processes are subjected to stepwise and hybrid mask pattern iterative optimization, and an interface between the ROI and the Ambit after optimization of a single slice is smoothened; and an optimized mask pattern is obtained through repeated circular iteration.

Figure 2:
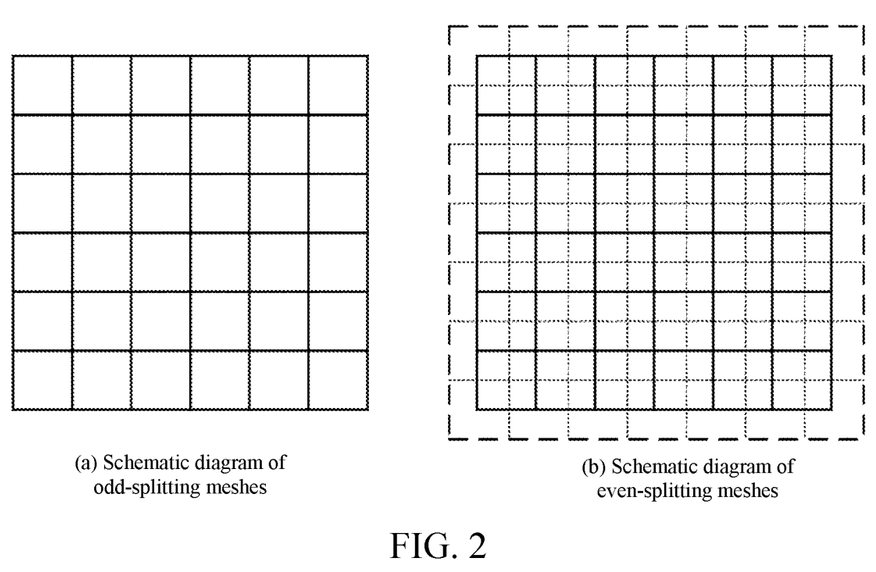
FIG. 2 is a schematic diagram illustrating the structures of the slices obtained by odd splitting and even splitting provided according to an embodiment of the present invention, in which (a) is a schematic diagram illustrating the structures of the slices obtained by odd splitting, and (b) is a schematic diagram illustrating the structures of the slices obtained by even splitting.

Further, the method comprises the following steps:

Step 1, as shown FIG. 2, the whole mask layout is subjected to odd splitting (referring to (a) in FIG. 2), to obtain a plurality of slices consisting of ROIs, Ambit, and the like; and in order to indicate the shapes and relative positions of the ROIs of a plurality of slices, a plurality of rectangles are used in the figure to denote the ROIs of a plurality of slices, while Ambit is not shown anymore, and the ROIs of a plurality of slices equally divide the whole mask image;

Step 2, the slices obtained by odd splitting are treated by a forward photolithographic imaging model to obtain emulated patterns on the photoresist, edge placement errors of the emulated patterns from target patterns are calculated, and it is judged whether the edge placement error on each slice reaches an allowable value; if so, iterative optimization is stopped, and the process jumps to Step 6; otherwise, the edge placement error is reversely solved to determine a side shift position, a side-shift correction is performed, and the interface part pattern between the corrected ROI of the slice and the Ambit is smoothened; and then the slices are directly merged;

Step 3, as shown in FIG. 2, the whole mask layout is expanded and subjected to even splitting by deviating for (1/2, 1/2) along two directions relative to the even splitting (referring to (b) in FIG. 2), where the ROI of a single slice has the same size as the ROI of the slice obtained by the odd splitting in Step 1.

Step 4, the slices obtained by even splitting are treated by a forward photolithographic imaging model to obtain emulated patterns on the photoresist, edge placement errors of the emulated patterns from target patterns are calculated, and it is judged whether the edge placement error on each slice reaches an allowable value; if so, iterative optimization is stopped, and the process jumps to Step 6; otherwise, the edge placement error is reversely solved to determine a side shift position, a side-shift correction is performed, and the interface part pattern between the corrected ROI of the slice and the Ambit is smoothened; and then the slices are directly merged, and the process jumps to Step 1.

Step 5, the above steps are circularly executed until Step 6 is executed; and

Step 6, the slices are directly merged, and an optimized mask image is output.

Figure 3:
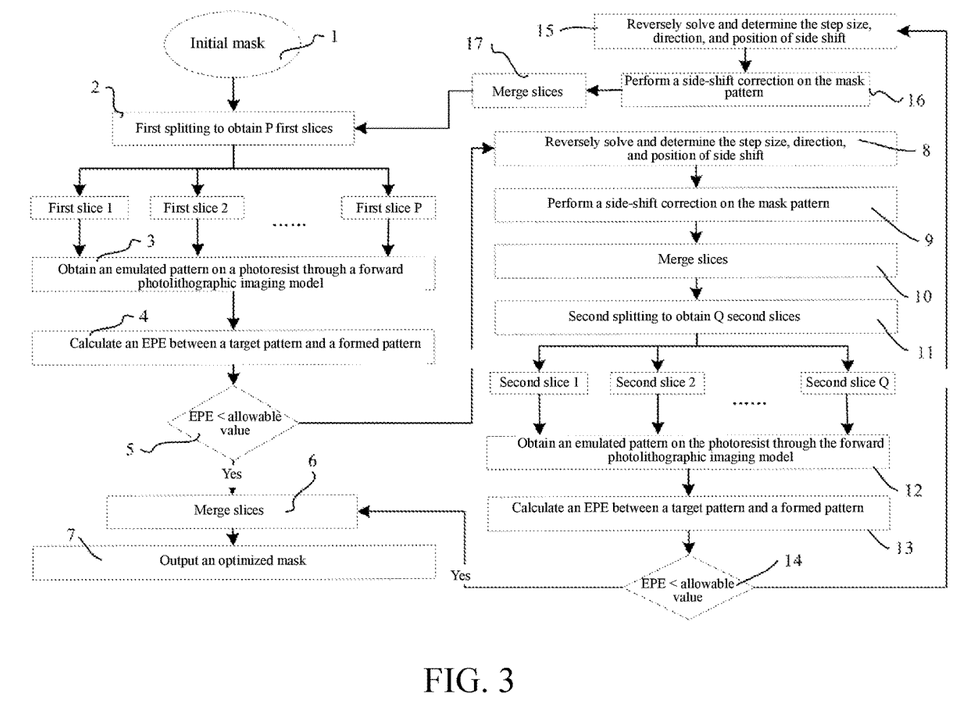
FIG. 3 is a schematic diagram illustrating a process flow of photolithographic mask optimization without border defects provided according to an embodiment of the present invention.

The method provided by the present invention has a process flow shown in FIG. 3, specifically divided into the following steps:

Step 1, determining an initial mask image to be optimized;

Step 2, performing first splitting on the input mask image, to obtain a plurality of first slices;

Step 3, taking the plurality of first slices as input, and obtaining an emulated pattern on the photoresist, of the mask pattern on each slice through a forward photolithographic imaging model;

Step 4, calculating an edge placement error (EPE) between the target pattern of each slice and the formed emulated pattern;

Step 5, judging whether the EPE of each slice is less than the allowable value; if the judgment result is yes, jumping to Step 6 and Step 7; and if the judgment result is no, executing Step 8;

Step 6, terminating the cycle, and directly merging the plurality of slices to obtain a mask image;

Step 7, outputting the merging result to obtain an optimized mask image, to finish the process of mask optimization;

Step 8, determining the parameters such as the step size and direction of side shift and the positions of the edges to be shifted by reversely solving the EPEs of the first slices;

Step 9, performing a side-shift correction on the mask patterns of the first slices, and smoothening the interface part patterns between the corrected ROIs of the slices and the Ambit;

Step 10, directly merging the plurality of first slices;

Step 11, expanding and extending the initially input mask image, and performing second splitting to obtain a plurality of second slices;

Step 12, taking the plurality of second slices as input, and obtaining an emulated pattern on the photoresist, of the mask pattern on each slice through a forward photolithographic imaging model;

Step 13, calculating an EPE between the target pattern of each slice and the formed emulated pattern;

Step 14, judging whether the EPE of each second slice is less than the allowable value; if the judgment result is yes, jumping to Step 6 and Step 7; and if the judgment result is no, executing Step 15;

Step 15, determining the parameters such as the step size and direction of side shift and the positions of the edges to be shifted by reversely solving the EPEs of the second slices;

Step 16, performing a side-shift correction on the mask patterns of the second slices, and smoothening the interface part patterns between the corrected ROIs of the slices and the Ambit; and Step 17, directly merging the plurality of second slices; and taking the obtained mask image as input, and circularly executing Step 1 and follow-up steps, to gradually eliminate the border defects caused by slice optimization in such a circular process, and gradually converging the EPEs into a set range.

Figure 4:
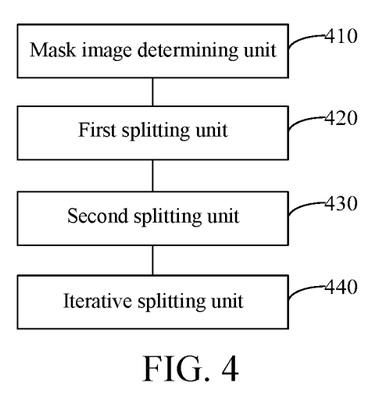
FIG. 4 is a structural diagram illustrating a photolithographic mask optimization system without border defects provided according to an embodiment of the present invention.

FIG. 4 is a structural diagram illustrating a photolithographic mask optimization system without border defects provided according to an embodiment of the present invention, as shown in FIG. 4, comprising:

a mask image determining unit 410 for determining a mask image corresponding to a mask pattern to be optimized, extending the periphery of the mask image outward, and setting a pixel value of the extended region to 0, to obtain an expanded mask image;

a first splitting unit 420 for performing first splitting on the current mask image to obtain a plurality of first slices, performing forward photolithographic imaging on the plurality of first slices to obtain a plurality of first emulated patterns of the plurality of first slices on a photoresist, calculating a plurality of first edge placement errors of the plurality of first emulated patterns from corresponding target patterns respectively, wherein the target patterns are patterns desired from the photoresist, performing first side-shift correction on the mask pattern to be optimized according to reverse solution results of the plurality of first edge placement errors when any error among the plurality of first edge placement errors exceeds a threshold, and merging the plurality of first slices and obtaining an updated mask image and an updated expanded mask image;

a second splitting unit 430 for performing second splitting on the current expanded mask image to obtain a plurality of second slices, extending the expanded mask image outward for a preset distance relative to the mask image, the first splitting and the second splitting being staggered from each other to ensure that boundaries of ROIs (region of interest) of the plurality of first slices all appear inside ROIs of the plurality of second slices, performing forward photolithographic imaging on the plurality of second slices to obtain a plurality of second emulated patterns of the plurality of second slices on the photoresist, calculating a plurality of second edge placement errors of the plurality of second emulated patterns from corresponding target patterns respectively, performing second side-shift correction on the mask pattern to be optimized according to reverse solution results of the plurality of second edge placement errors when any error among the plurality of second edge placement errors exceeds a threshold, and merging the plurality of second slices and obtaining an updated mask image and an updated expanded mask image; and an iterative splitting unit 440 for repeating the above-mentioned correction process on the newly obtained mask image and the newly obtained expanded mask image until none of the obtained plurality of edge placement errors exceeds the threshold, merging a plurality of slices obtained by final splitting, and outputting a mask image optimized by final correction.

It can be understood that the implementation of detailed functions of each unit in FIG. 4 may refer to the description in the above-mentioned embodiments of the method, which will not be described here again.

In addition, the present invention also provides a computer-readable storage medium, wherein the storage medium stores a computer program, and when executed by a processor, the computer program implements the method in the above embodiment.

Based on the method in the above embodiment, an embodiment of the present invention provides a computer program product that, when running on a processor, causes the processor to perform the method in the above embodiment.

Based on the method in the above embodiment, an embodiment of the present invention also provides a chip including one or more processors and an interface circuit. Optionally, the chip may also include a bus. Wherein:

The processor may be an integrated circuit chip with a signal processing capability. In the implementation process, the steps of the above method may be accomplished by an integrated logic circuit in the form of hardware or an instruction in the form of software in the processor. The above processor may be a general-purpose processor, a digital signal processor (DSP), an application-specific integrated circuit (ASIC), a field-programmable gate array (FPGA), or another programmable logic device, discrete gate, transistor logic device, or discrete hardware component. The methods and steps disclosed in the embodiments of this application may be implemented or performed. The general-purpose processor may be a microprocessor or may also be any conventional processor, etc.

The interface circuit may be used to transmit or receive data, instructions, or information. The processor may process the data, instructions, or other information received by the interface circuit, and the processed information may be transmitted through the interface circuit.

Optionally, the chip further includes a memory, and the memory may include read-only memory and random access memory and provide operation instructions and data to the processor. A portion of the memory may also include non-volatile random access memory (NVRAM).

Optionally, the memory stores executable software modules or data structures, and the processor may perform respective operations by invoking operating instructions (which may be stored in the operating system) stored in the memory.

Optionally, the interface circuit may be used to output the execution result of the processor.

It should be noted that the respective functions of the processor and the interface circuit may be implemented by means of a hardware design, may be implemented by means of a software design, or may be implemented by means of hardware and software in combination, which are not limited herein.

It should be understood that the steps of the above method embodiment may be accomplished by a logic circuit in the form of hardware or an instruction in the form of software in the processor.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. A photolithographic mask optimization method without border defects, comprising the following steps:
    determining a mask image corresponding to a mask pattern to be optimized, extending the periphery of the mask image outward, and setting a pixel value of the extended region to 0, to obtain an expanded mask image;
    performing first splitting on the current mask image to obtain a plurality of first slices, performing forward photolithographic imaging on the plurality of first slices to obtain a plurality of first emulated patterns of the plurality of first slices on a photoresist, and calculating a plurality of first edge placement errors of the plurality of first emulated patterns from corresponding target patterns respectively, wherein the target patterns are patterns desired from the photoresist;
    when any error among the plurality of first edge placement errors exceeds a threshold, performing first side-shift correction on the mask pattern to be optimized according to reverse solution results of the plurality of first edge placement errors, and then merging the plurality of first slices and obtaining an updated mask image and an updated expanded mask image;
    performing second splitting on the current expanded mask image to obtain a plurality of second slices, and extending the expanded mask image outward for a preset distance relative to the mask image, the first splitting and the second splitting being staggered from each other to ensure that boundaries of ROIs (region of interest) of the plurality of first slices all appear inside ROIs of the plurality of second slices;
    performing forward photolithographic imaging on the plurality of second slices to obtain a plurality of second emulated patterns of the plurality of second slices on the photoresist, and calculating a plurality of second edge placement errors of the plurality of second emulated patterns from corresponding target patterns respectively;
    when any error among the plurality of second edge placement errors exceeds a threshold, performing second side-shift correction on the mask pattern to be optimized according to reverse solution results of the plurality of second edge placement errors, and then merging the plurality of second slices and obtaining an updated mask image and an updated expanded mask image; and
    repeating the above-mentioned correction process on the newly obtained mask image and the newly obtained expanded mask image until none of the obtained plurality of edge placement errors exceeds the threshold, then merging a plurality of slices obtained by final splitting, and outputting a mask image optimized by final correction.

2. The method according to claim 1, wherein the performing first splitting on the mask image to obtain a plurality of first slices specifically comprises:
    uniformly splitting the mask image into a plurality of first rectangular images of the same area, a first rectangular image corresponding to the ROI of a first slice.

3. The method according to claim 2, wherein the performing second splitting on the expanded mask image to obtain a plurality of second slices specifically comprises:
uniformly splitting the expanded mask image into a plurality of second rectangular images of the same area, a second rectangular image corresponding to the ROI of a second slice, an ROI area of the second slice being an integral multiple of an ROI area of the first slice, the boundaries of the ROIs of the plurality of second slices not overlapping with the boundaries of the ROIs of the plurality of first slices, and the boundaries of the ROIs of the plurality of first slices all being inside the ROIs of the plurality of second slices.

4. The method according to claim 3, wherein the ROI area of the second slice is N times the ROI area of the first slice, and N is an integer greater than or equal to 1, and specifically,
the transverse side length of the ROI of the second slice is $N_1$ times the transverse side length of the ROI of the first slice, the longitudinal side length of the ROI of the second slice is $N_2$ times the longitudinal side length of the ROI of the first slice, $N_1*N_2=N$, and $N_1$ and $N_2$ are both an integer greater than or equal to 1.

5. The method according to claim 4, wherein the extending the expanded mask image outward for a preset distance relative to the mask image specifically comprises:
extending a transverse side of the expanded mask image outward for a first distance along a longitudinal direction;
extending another transverse side of the expanded mask image outward for a second distance along a longitudinal direction;
extending a longitudinal side of the expanded mask image outward for a third distance along a transverse direction; and
extending another longitudinal side of the expanded mask image outward for a fourth distance along a transverse direction,
wherein the first distance, the second distance, the third distance, and the fourth distance are based on the ROI area of the second slice being N times the ROI area of the first slice while the boundaries of the ROIs of the plurality of first slices all appear inside the ROIs of the plurality of second slices.

6. The method according to claim 1, wherein the ROI area of the first slice is set to be equal to the ROI area of the second slice, and both the ROI of the first slice and the ROI of the second slice are a square;
the periphery of the mask image is extended outward for half of the side length of the square, to obtain the expanded mask image; and
transverse sides and longitudinal sides of the ROI of the second slice are all controlled to deviate from corresponding sides of the ROI of the first slice for half of the side length of the square, and the expanded mask image is split to obtain the plurality of second slices.

7. A photolithographic mask optimization system without border defects, comprising: a mask image determining unit for determining a mask image corresponding to a mask pattern to be optimized, extending the periphery of the mask image outward, and setting a pixel value of the extended region to 0, to obtain an expanded mask image;
a first splitting unit for performing first splitting on the current mask image to obtain a plurality of first slices, performing forward photolithographic imaging on the plurality of first slices to obtain a plurality of first emulated patterns of the plurality of first slices on a photoresist, calculating a plurality of first edge placement errors of the plurality of first emulated patterns from corresponding target patterns respectively, wherein the target patterns are patterns desired from the photoresist, performing first side-shift correction on the mask pattern to be optimized according to reverse solution results of the plurality of first edge placement errors when any error among the plurality of first edge placement errors exceeds a threshold, and merging the plurality of first slices and obtaining an updated mask image and an updated expanded mask image;
a second splitting unit for performing second splitting on the current expanded mask image to obtain a plurality of second slices, extending the expanded mask image outward for a preset distance relative to the mask image, the first splitting and the second splitting being staggered from each other to ensure that boundaries of ROIs (region of interest) of the plurality of first slices all appear inside ROIs of the plurality of second slices, performing forward photolithographic imaging on the plurality of second slices to obtain a plurality of second emulated patterns of the plurality of second slices on the photoresist, calculating a plurality of second edge placement errors of the plurality of second emulated patterns from corresponding target patterns respectively, performing second side-shift correction on the mask pattern to be optimized according to reverse solution results of the plurality of second edge placement errors when any error among the plurality of second edge placement errors exceeds a threshold, and merging the plurality of second slices and obtaining an updated mask image and an updated expanded mask image; and
an iterative splitting unit for repeating the above-mentioned correction process on the newly obtained mask image and the newly obtained expanded mask image until none of the obtained plurality of edge placement errors exceeds the threshold, merging a plurality of slices obtained by final splitting, and outputting a mask image optimized by final correction.

8. The system according to claim 7, wherein the first splitting unit performing first splitting on the mask image to obtain a plurality of first slices specifically comprises: uniformly splitting the mask image into a plurality of first rectangular images of the same area, a first rectangular image corresponding to the ROI of a first slice; and
the second splitting unit performing second splitting on the expanded mask image to obtain a plurality of second slices specifically comprises: uniformly splitting the expanded mask image into a plurality of second rectangular images of the same area, a second rectangular image corresponding to the ROI of a second slice, an ROI area of the second slice being an integral multiple of an ROI area of the first slice, the boundaries of the ROIs of the plurality of second slices not overlapping with the boundaries of the ROIs of the plurality of first slices, and the boundaries of the ROIs of the plurality of first slices all being inside the ROIs of the plurality of second slices.

9. The system according to claim 8, wherein the ROI area of the second slice obtained from splitting by the second splitting unit is N times the ROI area of the first slice, and N is an integer greater than or equal to 1, and specifically, the transverse side length of the ROI of the second slice is $N_1$ times the transverse side length of the ROI of the first slice, the longitudinal side length of the ROI of the second slice is $N_2$ times the longitudinal side length of the ROI of the first slice, $N_1*N_2=N$, and $N_1$ and $N_2$ are both an integer greater than or equal to 1.

10. The system according to claim 9, wherein the extending the expanded mask image determined by the mask image determining unit outward for a preset distance relative to the mask image specifically comprises: extending a transverse side of the expanded mask image outward for a first distance along a longitudinal direction; extending another transverse side of the expanded mask image outward for a second distance along a longitudinal direction; extending a longitudinal side of the expanded mask image outward for a third distance along a transverse direction; and extending another longitudinal side of the expanded mask image outward for a fourth distance along a transverse direction, wherein the first distance, the second distance, the third distance, and the fourth distance are based on the ROI area of the second slice being N times the ROI area of the first slice while the boundaries of the ROIs of the plurality of first slices all appear inside the ROIs of the plurality of second slices.

* * * * *